United States Patent
Ko (10) Patent No.: US 9,041,333 B2
(45) Date of Patent: May 26, 2015

(54) MOTOR DRIVING CONTROL APPARATUS, MOTOR DRIVING CONTROL METHOD, AND MOTOR USING THE SAME

(71) Applicant: Samsung Electro-Mechanics Co., Ltd., Suwon, Gyunggi-do (KR)

(72) Inventor: Joo Yul Ko, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 63 days.

(21) Appl. No.: 13/896,957

(22) Filed: May 17, 2013

(65) Prior Publication Data

US 2014/0176035 A1    Jun. 26, 2014

(30) Foreign Application Priority Data

Dec. 21, 2012    (KR) .......................... 10-2012-0150862

(51) Int. Cl.
| | |
|---|---|
| *H02P 1/30* | (2006.01) |
| *H02P 7/06* | (2006.01) |
| *H02P 27/04* | (2006.01) |
| *G01R 19/00* | (2006.01) |

(52) U.S. Cl.
CPC .............. *H02P 7/06* (2013.01); *G01R 19/0092* (2013.01); *H02P 27/04* (2013.01)

(58) Field of Classification Search
CPC ...................................................... H02P 29/00
USPC ............................................ 318/503; 701/42
See application file for complete search history.

(56) References Cited

U.S. PATENT DOCUMENTS

| | | | |
|---|---|---|---|
| 5,898,649 | A | 4/1999 | Park |
| 2011/0231066 | A1* | 9/2011 | Ohno et al. ..................... 701/42 |

FOREIGN PATENT DOCUMENTS

| | | |
|---|---|---|
| JP | 10-337077 A | 12/1998 |
| JP | 2001-061291 A | 3/2001 |
| JP | 2012-046075 A | 3/2012 |
| JP | 2013-158197 A | 8/2013 |
| KR | 1998-061644 | 4/1999 |

OTHER PUBLICATIONS

Japanese Office Action issued in Japanese Application No. 2013-097509, dated May 27, 2014, with English translation.
Office Action Korean Patent Application No. 10-2012-0150862 dated Nov. 26, 2013 with English translation.

* cited by examiner

*Primary Examiner* — Shawki S Ismail
*Assistant Examiner* — Bradley Brown
(74) *Attorney, Agent, or Firm* — McDermott Will & Emery LLP (57) ABSTRACT

There are provided a motor driving control apparatus, a motor driving control method, and a motor using the same. The motor driving control apparatus includes a controller, a duty ratio calculation unit, and a driving signal generation unit. The controller generates a speed control signal by using at least one of a speed signal of a motor device and a speed command signal input from the outside. The duty ratio calculation unit calculates a duty ratio of the speed control signal. The driving signal generation unit generates a driving control signal for controlling driving of the motor device by using the duty ratio.

15 Claims, 6 Drawing Sheets

MOTOR DRIVING CONTROL APPARATUS, MOTOR DRIVING CONTROL METHOD, AND MOTOR USING THE SAME

CROSS-REFERENCE TO RELATED APPLICATIONS

This application claims the priority of Korean Patent Application No. 10-2012-0150862 filed on Dec. 21, 2012, in the Korean Intellectual Property Office, the disclosure of which is incorporated herein by reference.

BACKGROUND OF THE INVENTION

1. Field of the Invention

The present invention relates to a motor driving control apparatus, a motor driving control method, and a motor using the same.

2. Description of the Related Art

In line with the development of motor technologies, motors having various sizes have been used in diverse technical fields.

In general, a motor is driven by rotating a rotor by using a permanent magnet and a coil having polarity changing according to an applied current. Initially, a brush type motor having a coil in a rotor was provided, which, however, had a problem in that a brush thereof was abraded or sparks were generated.

Thus, recently, various types of brushless motors have been used globally. A brushless motor, eliminating mechanical contact units such as a brush, a rectifier, or the like, is a direct current (DC) motor driven by using an electronic commutating mechanism instead. The brushless motor may include a stator configured as a permanent magnet and a rotor having coils corresponding to a plurality of phases and rotating by magnetic force generated by phase voltages of the respective coils.

In order to accurately drive a motor, a speed of the motor is required to be detected to control driving thereof.

Here, various types of signal may be used as a speed control signal. For example, a pulse width modulation (PWM) signal or a DC voltage signal may be used as a speed control signal.

However, since types of speed control signals are different, control circuits are required to be configured for the respective speed signals. Thus, a configuration of a motor driving control apparatus may be complicated, having a limitation in that a size of the motor driving control apparatus may be inevitably increased.

Related art documents below relate to a motor technology, which, however, do not provide a solution to the foregoing problems.

RELATED ART DOCUMENT (Patent document 1) Korean Patent Laid Open Publication No. 1998-061644

(Patent document 2) Japanese Patent Laid Open Publication No. 2012-046075

SUMMARY OF THE INVENTION

An aspect of the present invention provides a motor driving control apparatus capable of simply identifying a type of speed control signal by using analog-to-digital conversion, and easily calculating a duty ratio according to the identified type of the speed control signal, a motor driving control method, and a motor using the same.

According to an aspect of the present invention, there is provided a motor driving control apparatus including: a controller generating a speed control signal by using at least one of a speed signal of a motor device and a speed command signal input from the outside; a duty ratio calculation unit calculating a duty ratio of the speed control signal; and a driving signal generation unit generating a driving control signal for controlling driving of the motor device by using the duty ratio.

The motor driving control apparatus may further include: an inverter unit supplying driving power to at least one of a plurality of phases of the motor device according to the driving control signal.

The speed control signal may include a pulse width modulation (PWM) signal or a direct current (DC) voltage signal, wherein the duty ratio calculation unit may calculate the duty ratio upon identifying the speed control signal as being the PWM signal or the DC voltage signal.

The duty ratio calculation unit may include: a signal identifier determining whether the speed control signal is a PWM signal or a DC voltage signal; and a DC duty ratio calculator detecting speed information from the DC voltage signal when the DC voltage signal is received from the signal identifier, and calculating the duty ratio from the speed signal.

The duty ratio calculation unit may further include a PWM duty ratio calculator calculating the duty ratio from the PWM signal, when the PWM signal is received from the signal identifier.

The signal identifier may perform analog-to-digital conversion on the speed control signal, and when the speed control signal has been changed within a pre-set reference time, the signal identifier may provide the speed control signal to the PWM duty ratio calculator, and when the speed control signal has not been changed within the pre-set reference time, the signal identifier may provide the speed control signal to the DC duty ratio calculator.

According to another aspect of the present invention, there is provided a motor including: a motor device rotating by using driving power provided from the outside; and a motor driving control apparatus controlling driving of the motor device by providing the driving power to the motor device according to a driving control signal, wherein the motor driving control apparatus generates the driving control signal by determining a duty ratio of the driving control signal irrespective of a type of the speed control signal.

The speed control signal may be any one of a pulse width modulation (PWM) signal and a direct current (DC) voltage signal.

The motor driving control apparatus may include: a controller generating a speed control signal by using at least one of a speed signal of a motor device and a speed command signal input from the outside; a duty ratio calculation unit calculating a duty ratio of the speed control signal; and a driving signal generation unit generating a driving control signal by using the duty ratio.

The duty ratio calculation unit may include: a signal identifier determining whether the speed control signal is a PWM signal or a DC voltage signal; a DC duty ratio calculator detecting speed information from the DC voltage signal when the DC voltage signal is received from the signal identifier, and calculating the duty ratio from the speed signal; and a PWM duty ratio calculator calculating the duty ratio from the PWM signal, when the PWM signal is received from the signal identifier.

The signal identifier may perform analog-to-digital conversion on the speed control signal, and when the speed control signal has been changed within a pre-set reference time, the signal identifier may provide the speed control signal to the PWM duty ratio calculator, and when the speed control signal has not been changed within the pre-set reference time, the signal identifier may provide the speed control signal to the DC duty ratio calculator.

According to another aspect of the present invention, there is provided a motor driving control method performed by a motor driving control apparatus for controlling driving of a motor device, including: converting a speed control signal into a digital value; determining a type of the speed control signal according to whether the digitally converted value has been changed within a pre-set reference time; and calculating a duty ratio from the speed control signal through different methods according to types of the speed control signals.

The determining of a type of the speed control signal may include: determining whether the digitally converted value has been changed within the reference time; when the digitally converted value has been changed within the reference time, determining the speed control signal as a pulse width modulation (PWM) signal; and when the digitally converted value has not been changed within the reference time, determining the speed control signal as a direct current (DC) voltage signal.

The calculating of the duty ratio may include: when the speed control signal is a DC voltage signal, detecting speed information from the digitally converted value; and calculating the duty ratio by using the detected speed information.

The calculating of the duty ratio may include: when the speed control signal is a PWM signal, calculating the duty ratio from the PWM signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like components.

Hereinafter, embodiments of the present invention will be described based on a brushless motor for the purposes of description. However, obviously, the scope of the present invention is not necessarily limited to the brushless motor.

Also, hereinafter, a motor itself will be referred to as a motor device 200, and a motor driving control apparatus 100 for controlling driving of the motor device, and the motor device 200 will be generally referred to as a motor.

Figure 1:
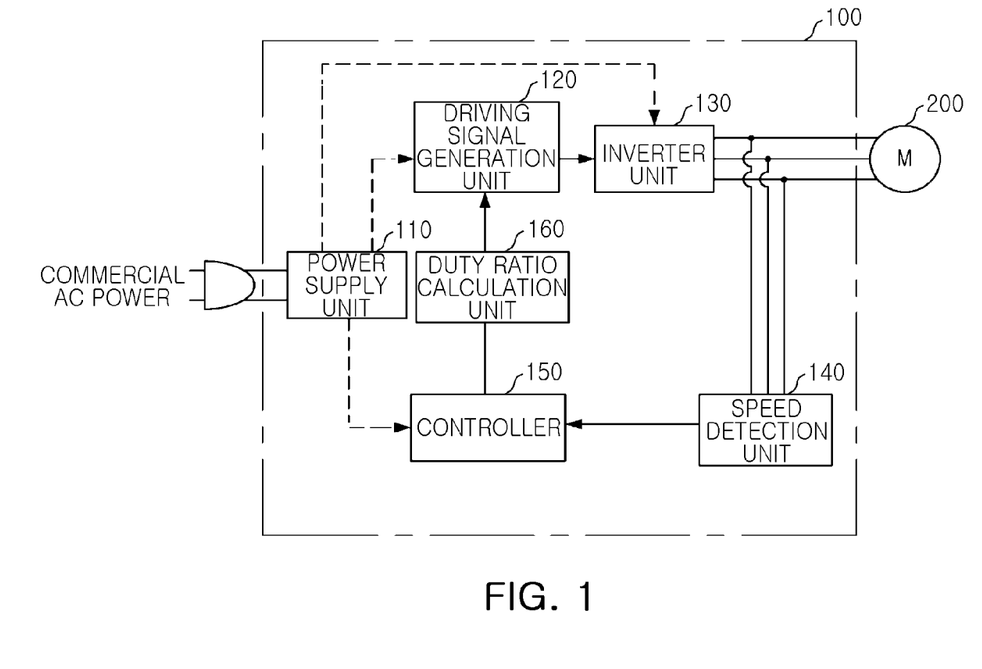
FIG. 1 is a block diagram of a motor driving control apparatus according to an embodiment of the present invention.

FIG. 1 is a block diagram of a motor driving control apparatus according to an embodiment of the present invention.

The motor device 200 may perform a rotational operation according to a driving control signal. For example, a magnetic field may be produced by each coil of the motor device 200 according to a driving current provided from the inverter unit 130. A rotor installed in the motor device 200 may be rotated by the magnetic fields produced by the coils.

The motor driving control apparatus 100 may control driving of the motor device 200 by providing driving power to the motor device 200 according to the driving control signal. Here, the motor driving control apparatus 100 may generate the driving control signal by determining a duty ratio of the driving control signal irrespective of a type of speed control signal.

In an embodiment, the driving control signal may be a pulse width modulation (PWM) signal having a variable duty ratio. Also, a speed signal is a signal indicating a driving speed, and a speed control signal is a signal for controlling a change in speed. Also, a speed command signal is a signal regarding a speed control request input from the outside of the motor driving control apparatus 100.

As illustrated in FIG. 1, the motor driving control apparatus 100 may include a power supply unit 110, a driving signal generation unit 120, an inverter unit 130, a speed detection unit 140, a controller 150, and a duty ratio calculation unit 160.

The power supply unit 110 may supply power to the respective elements of the motor driving control apparatus 100. For example, the power supply unit 110 may convert an AC voltage of commercial power into a direct current (DC) voltage and supply the same. In the illustrated example, the dotted lines indicate predetermined power supplied from the power supply unit 110.

The driving signal generation unit 120 may provide a driving control signal to the inverter unit 130. In detail, the driving signal generation unit 120 may generate a driving control signal for controlling driving of the motor device 200 by using a duty ratio provided from the duty ratio calculation unit 160.

Here, the driving control signal may be a PWM signal. In such a case, the driving signal generation unit 120 may adjust a duty of the PWM signal by applying a variable DC level to a predetermined reference waveform (e.g., a triangular wave).

The inverter unit 130 may enable the motor device 200 to operate. In detail, the inverter unit 130 may supply driving power to at least one of a plurality of phases of the motor device 200 according to a driving control signal provided from the driving signal generation unit 120. For example, the inverter unit 130 may convert a DC voltage into a multi-phase (e.g., 3-phase to 4-phase) voltage according to a driving control signal and apply the same to coils (corresponding to the plurality of phases) of the motor device 200 to produce magnetic fields, respectively.

The inverter unit 130 will be described in detail with reference to FIG. 2, hereinafter.

The speed detection unit 140 may detect a rotational speed of the motor device 200. The speed detection unit 140 may provide a speed signal regarding the detected rotational speed to the controller 150, and the controller 150 may generate a speed control signal based on the speed signal.

In an embodiment, the speed detection unit 140 may calculate a rotational speed of the motor device 200 by detecting back electromotive force. Alternatively, the speed detection unit 140 may provide the detected back electromotive force to the controller 150 so as to be used for determining a phase change timing of the motor device 200.

The controller 150 may check a phase change timing of the motor device 200 and control the driving signal generation unit 120 to generate a driving control signal by using the checked phase change timing. For example, the controller 150 may control the driving signal generation unit 120 to perform a phase change at a zero-crossing timing of back electromotive force.

Also, the controller 150 may generate a speed control signal by using at least one of a speed signal of the motor device 200 and a speed command signal input from the outside.

Here, the speed control signal may comprehensively refer to various types of signals. For example, the speed control signal may include a pulse width modulation signal or a DC voltage signal.

The duty ratio calculation unit 160 may calculate a duty ratio of the speed control signal provided from the controller 150. The duty ratio calculation unit 160 may provide the calculated duty ratio to the driving signal generation unit 120, and the driving signal generation unit 120 may generate a driving control signal by using the duty ratio provided from the duty ratio calculation unit 160 or a phase change signal provided from the controller 150.

The duty ratio calculation unit 160 will be described in detail with reference to FIGS. 3 through 5.

Figure 2:
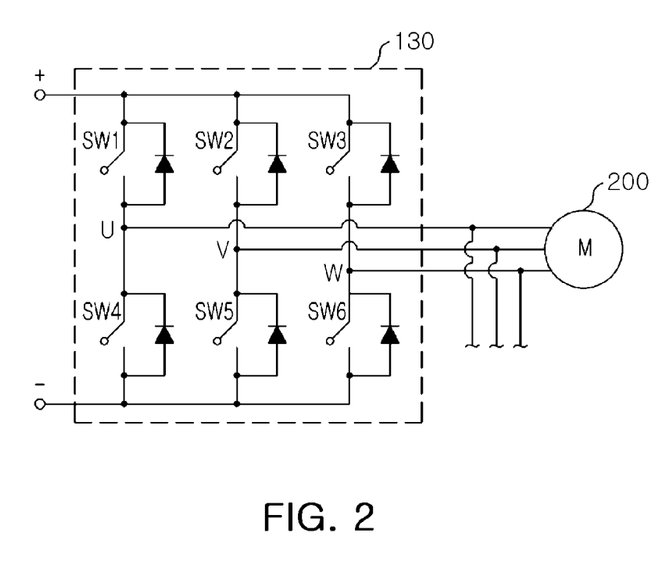
FIG. 2 is a brief circuit diagram illustrating an example of an inverter unit of FIG. 1.

FIG. 2 is a brief circuit diagram illustrating an example of an inverter unit of FIG. 1.

Referring to FIGS. 1 and 2, the inverter unit 130 may include a plurality of higher switch elements SW1 to SW3 connected to a positive (+) power source terminal and a plurality of lower switch elements SW4 to SW6 provided between the respective higher switch elements SW1 to SW3 and a power source terminal. Contacts between the respective higher switch elements SW1 to SW3 and the lower switch elements SW4 to SW6 are connected to respective coils U, V, W.

The higher switch elements SW1 to SW3 of the inverter unit 130 are sequentially turned on, and the lower switch elements SW4 to SW6 are turned on or off to a state opposite to that of the higher switch elements SW4 to SW6. Here, when the switch element SW1 is turned on, a positive (+) voltage is applied to the U coil of the motor device 200, and as the switch element SW6 is turned on during the operation, a negative (−) voltage is applied to the W coil. Accordingly, magnetic forces having opposite polarities are generated between the U coil and the W coil and a rotor is rotated by 60 degrees according to the interaction of the magnetic forces. Subsequently, as the switch element SW1 is turned off and the switch element SW2 is turned on, magnetic force having polarity opposite to that of the magnetic force generated by the W coil is generated by the V coil, and according to this magnetic force, the motor device 200 is rotated further by 60 degrees. Similarly, while the switch element SW2 is in an ON state, the switch SW6 is turned off and the switch element SW4 is turned on, magnetic force having a polarity opposite to that of the magnetic force of the V coil is generated by the U coil, and the rotor is further rotated by 60 degrees. Next, as the switch element SW2 is turned off, the switch element SW3 is turned on, magnetic forces having opposite polarities are generated by the U coil and the W coil, the motor device 200 is further rotated by 60 degrees, the switching element SW4 is subsequently turned off and the switch element SW5 is turned on, and thus, the rotor is rotated by 60 degrees by the magnetic forces of the U coil and the V coil.

As this process is repeatedly performed, the rotor is continuously rotated to operate the motor device 200.

Figure 3:
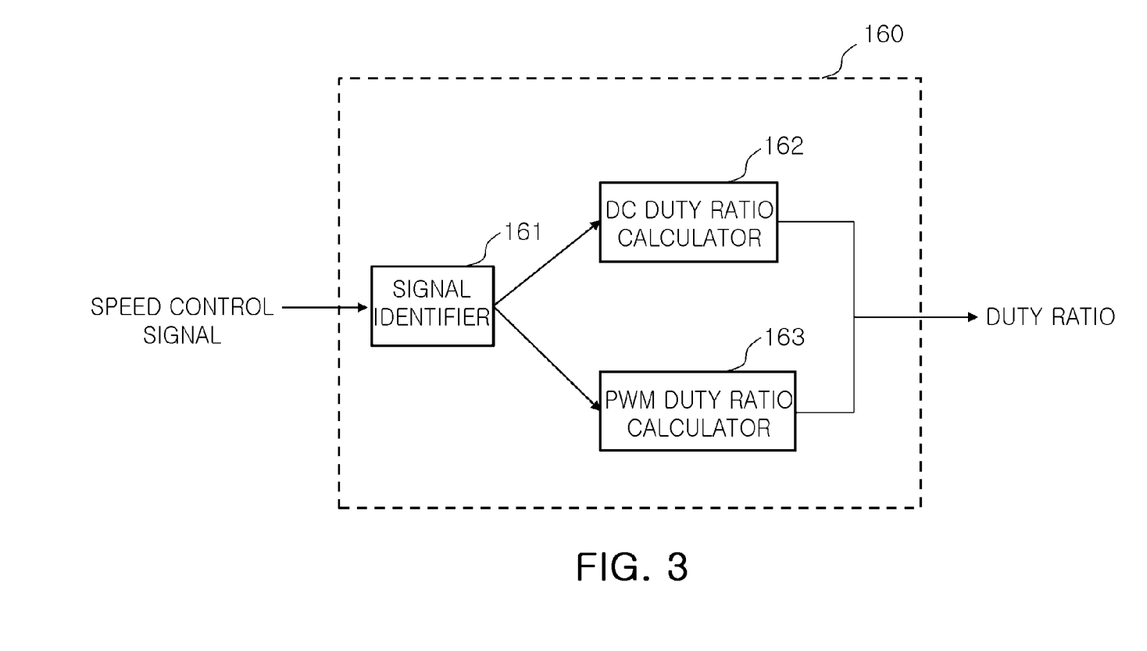
FIG. 3 is a view illustrating a configuration of a duty ratio calculation unit of FIG. 1.
Figure 4:
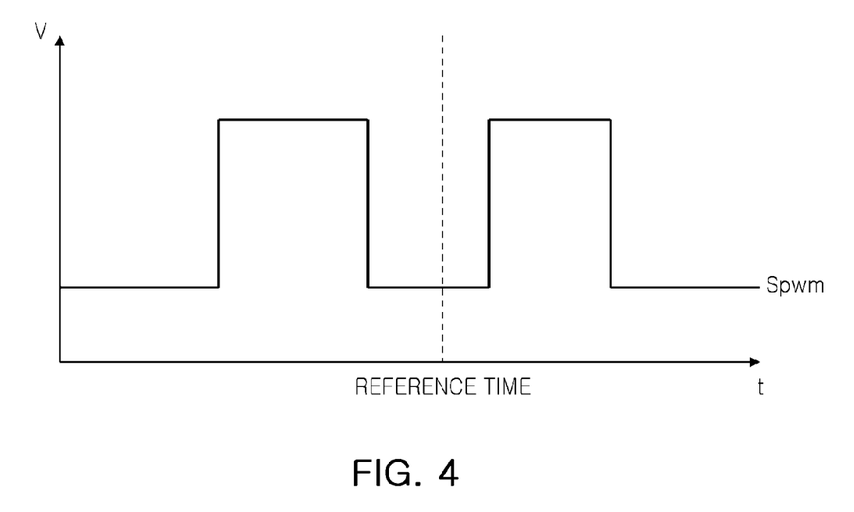
FIGS. 4 and 5 are reference graphs showing a signal identifier for identifying a pulsed width modulation (PWM) signal and a direct current (DC) voltage.
Figure 5:
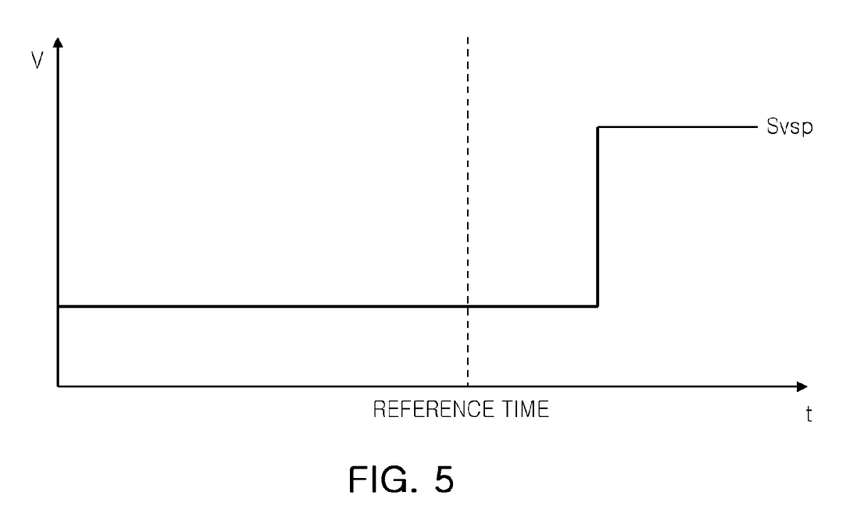

FIG. 3 is a view illustrating a configuration of a duty ratio calculation unit of FIG. 1, and FIGS. 4 and 5 are reference graphs showing a signal identifier for identifying a pulsed width modulation (PWM) signal and a DC voltage.

Hereinafter, the duty ratio calculation unit 160 will be described in detail with reference to FIGS. 3 through 5.

The duty ratio calculation unit 160 may identify the speed control signal as to whether it is a PWM signal or a DC voltage signal, and calculate a duty ratio. In detail, referring to FIG. 3, the duty ratio calculation unit 160 may include a signal identifier 161, a DC duty ratio calculator 162, and a PWM duty ratio calculator 163.

The signal identifier 161 may determine as to whether the speed control signal is a PWM signal or a DC voltage signal.

In an embodiment, the signal identifier 161 may perform analog-to-digital conversion on the speed control signal, and when the speed control signal has been changed within a pre-set reference time, the signal identifier 161 may determine that the speed control signal is a PWM voltage signal. Meanwhile, when the speed control signal has not been changed within the pres-set reference time, the signal identifier 161 may determine that the speed control signal is a DC signal.

The operation of the signal identifier 161 will be described in detail with reference to FIGS. 4 and 5. The signal identifier 161 may perform analog-to-digital conversion on the received speed control signal. To this end, the signal identifier 161 may be implemented as an analog-to-digital converter (ADC).

Thereafter, the signal identifier 161 may determine whether a value of the speed control signal has been changed within the pre-set reference time.

In the example of FIG. 4, since the value of the speed control signal Spwm has been changed within the reference time, the signal identifier 161 may determine that the corresponding speed control signal is a PWM signal. This is because, in the case of the PWM signal, it has a uniform period although it has a variable pulse width. Thus, here, preferably, the reference time is a time greater than at least one period of the PWM signal.

Meanwhile, in the example of FIG. 5, since the value of the speed control signal Svsp has been changed after the pre-set reference time, the signal identifier 161 may determine that the speed control signal is a DC voltage signal. This is because the DC voltage signal does not have a certain period.

Meanwhile, even in the case of the DC voltage signal, it may have at least one variable value within the reference time. Thus, in an embodiment, the signal identifier 161 may perform a process of determining whether the value of the speed control signal has been changed within the pre-set reference time, a plurality of times to determine a type of the speed control signal.

Referring back to FIG. 3, when the speed control signal is a DC voltage signal, the signal identifier 161 may provide the DC voltage signal to the DC duty ratio calculator 162. Meanwhile, when the speed control signal is a PWM signal, the signal identifier 161 may provide the speed control signal to the PWM duty ratio calculator 163.

When the DC duty ratio calculator 162 receives the DC voltage signal from the signal identifier 161, the DC duty ratio calculator 162 may detect speed information from the DC voltage signal and calculate a duty ratio from the detected speed signal.

In an embodiment, the DC duty ratio calculator 162 may receive the analog-to-digital converted DC voltage signal from the signal identifier 161, and calculate a duty ratio with respect to the analog-to-digital converted DC voltage signal. For example, the DC duty ratio calculator 162 may calculate a duty ratio (20%) by detecting a number (e.g., 2,000) by which the analog-to-digital converted DC voltage signal has a high value based on a predetermined clock (e.g., 10,000).

When the PWM duty ratio calculator 163 receives the PWM signal from the signal identifier 161, the PWM duty ratio calculator 163 may calculate a duty ratio from the PWM signal.

Here, since the speed control signal provided from the signal identifier 161 is a PWM signal, PWM duty ratio calculator 163 may receive the speed control signal, which has been input to the signal identifier 161, as it is. Namely, the PWM duty ratio calculator 163 may receive the PWM signal bypassed from the signal identifier 161, as an input.

Figure 6:
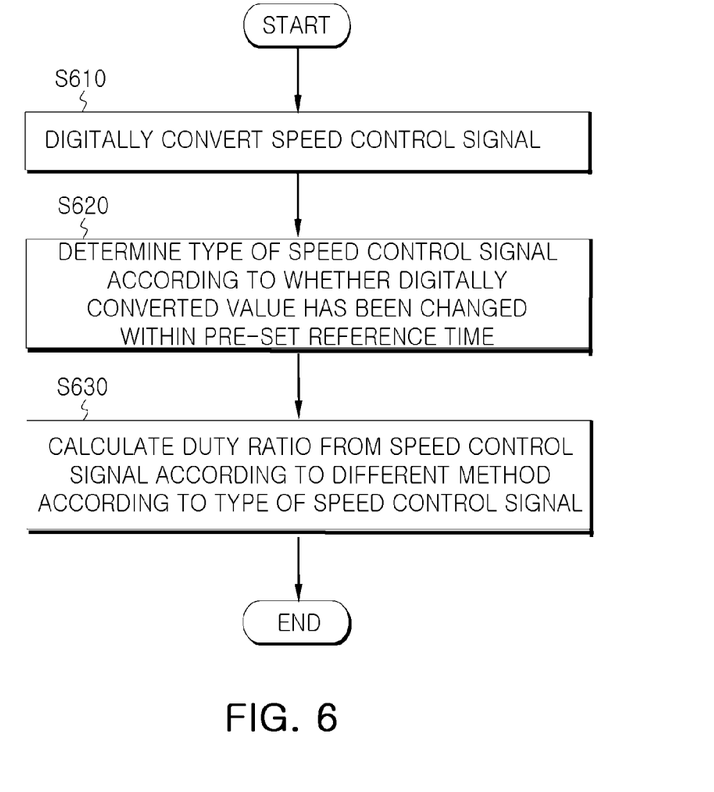
FIG. 6 is a flow chart illustrating a motor driving control method according to an embodiment of the present invention.
Figure 7:
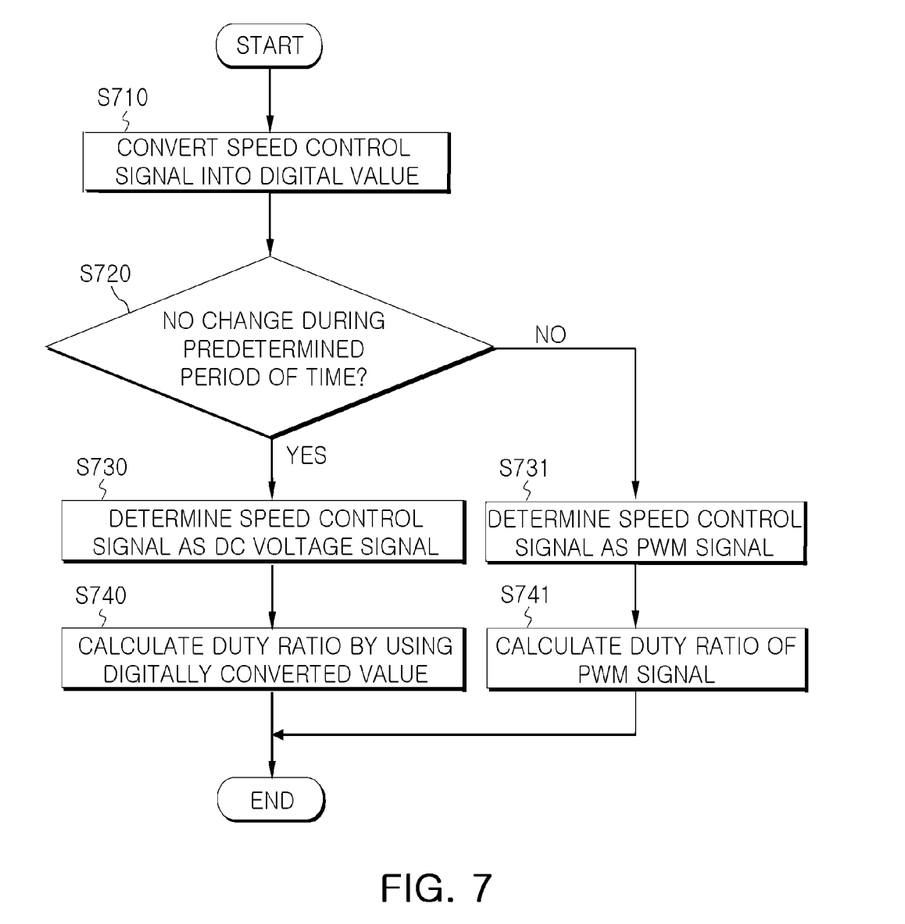
FIG. 7 is a flow chart illustrating a motor driving control method according to another embodiment of the present invention.

FIGS. 6 and 7 are flow charts illustrating a motor driving control method according to embodiments of the present invention.

Hereinafter, a motor driving control method according to an embodiment of the present invention will be described. The motor driving control method according to an embodiment of the present invention is performed by the motor driving control apparatus 100 described above with reference to FIGS. 1 through 5, so a description of content, which is the same or equivalent to that of the foregoing description, will be omitted.

Referring to FIG. 6, the motor driving control apparatus 100 may digitally convert a speed control signal (S610).

Thereafter, the motor driving control apparatus 100 may determine a type of the speed control signal according to whether the digitally converted value has been changed within a pre-set reference time (S620).

The motor driving control apparatus 100 may calculate a duty ratio from the speed control signal differently according to types of the speed control signals (S630).

Referring to FIG. 7, the motor driving control apparatus 100 may digitally convert a speed control signal (S710).

Thereafter, the motor driving control apparatus 100 may determine whether the digitally converted speed control signal has been changed within a pre-set reference time (S720).

When the digitally converted speed control signal has been changed (S720, NO), the motor driving control apparatus 100 may determine that the speed control signal is a PWM signal (S731), and calculate a duty ratio from the PWM signal (S741).

Meanwhile, when the digitally converted speed control signal has not been changed (S720, YES), the motor driving control apparatus 100 may determine that the speed control signal is a DC voltage signal (S730).

Thereafter, the motor driving control apparatus 100 may detect speed information from the digitally converted value (S730), and calculate a duty ratio by using the detected speed information (S740).

As set forth above, according to embodiments of the invention, a type of speed control signal can be simply identified by using analog-to-digital conversion, and a duty ratio can be easily calculated according to the identified type of the speed control signal.

While the present invention has been shown and described in connection with the embodiments, it will be apparent to those skilled in the art that modifications and variations can be made without departing from the spirit and scope of the invention as defined by the appended claims.

What is claimed is:

1. A motor driving control apparatus comprising:
   a controller generating a speed control signal by using at least one of a speed signal of a motor device and a speed command signal input from outside;
   a duty ratio calculation unit calculating a duty ratio of the speed control signal; and
   a driving signal generation unit generating a driving control signal for controlling driving of the motor device by using the duty ratio,
   wherein the duty ratio calculation unit determines that the speed control signal is a DC voltage signal when the speed control signal is not changed within a pre-set reference time.

2. The motor driving control apparatus of claim 1, further comprising: an inverter unit supplying driving power to at least one of a plurality of phases of the motor device according to the driving control signal.

3. The motor driving control apparatus of claim 1, wherein the speed control signal includes a pulse width modulation (PWM) signal or a direct current (DC) voltage signal,
   wherein the duty ratio calculation unit calculates the duty ratio upon identifying the speed control signal as being the PWM signal or the DC voltage signal.

4. The motor driving control apparatus of claim 1, wherein the duty ratio calculation unit comprises:
   a signal identifier determining whether the speed control signal is a PWM signal or a DC voltage signal; and
   a DC duty ratio calculator detecting speed information from the DC voltage signal when the DC voltage signal is received from the signal identifier, and calculating the duty ratio from the speed signal.

5. The motor driving control apparatus of claim 4, wherein the duty ratio calculation unit further comprises a PWM duty ratio calculator calculating the duty ratio from the PWM signal, when the PWM signal is received from the signal identifier.

6. The motor driving control apparatus of claim 5, wherein the signal identifier performs analog-to-digital conversion on the speed control signal, and when the speed control signal has been changed within the pre-set reference time, the signal identifier provides the speed control signal to the PWM duty ratio calculator, and when the speed control signal has not been changed within the pre-set reference time, the signal identifier provides the speed control signal to the DC duty ratio calculator.

7. A motor comprising:
   a motor device rotating by using driving power provided from the outside; and
   a motor driving control apparatus controlling driving of the motor device by providing the driving power to the motor device according to a driving control signal,
   wherein the motor driving control apparatus generates the driving control signal by determining a duty ratio of the driving control signal irrespective of a type of the speed control signal, wherein the motor driving control apparatus determines that the speed control signal is a DC voltage signal when the speed control signal is not changed within a pre-set reference time.

8. The motor of claim 7, wherein the speed control signal is any one of a pulse width modulation (PWM) signal and a direct current (DC) voltage signal.

9. The motor of claim 7, wherein the motor driving control apparatus comprises:
- a controller generating a speed control signal by using at least one of a speed signal of a motor device and a speed command signal input from the outside;
- a duty ratio calculation unit calculating a duty ratio of the speed control signal; and
- a driving signal generation unit generating a driving control signal by using the duty ratio.

10. The motor of claim 9, wherein the duty ratio calculation unit comprises:
- a signal identifier determining whether the speed control signal is a PWM signal or a DC voltage signal;
- a DC duty ratio calculator detecting speed information from the DC voltage signal when the DC voltage signal is received from the signal identifier, and calculating the duty ratio from the speed signal; and
- a PWM duty ratio calculator calculating the duty ratio from the PWM signal, when the PWM signal is received from the signal identifier.

11. The motor of claim 10, wherein the signal identifier performs analog-to-digital conversion on the speed control signal, and when the speed control signal has been changed within the pre-set reference time, the signal identifier provides the speed control signal to the PWM duty ratio calculator, and when the speed control signal has not been changed within the pre-set reference time, the signal identifier provides the speed control signal to the DC duty ratio calculator.

12. A motor driving control method performed by a motor driving control apparatus for controlling driving of a motor device, the method comprising:
- converting a speed control signal into a digital value;
- determining a type of the speed control signal according to whether the digitally converted value has been changed within a pre-set reference time; and
- calculating a duty ratio from the speed control signal through different methods according to types of the speed control signals,
- wherein the determining of the type of the speed control signal comprises determining that the speed control signal is a DC voltage signal when the speed control signal is not changed within the pre-set reference time.

13. The motor driving control method of claim 12, wherein the determining of a type of the speed control signal further comprises:
- determining whether the digitally converted value has been changed within the reference time; and
- when the digitally converted value has been changed within the reference time, determining the speed control signal as a pulse width modulation (PWM) signal.

14. The motor driving control method of claim 12, wherein the calculating of the duty ratio comprises:
- when the speed control signal is the DC voltage signal, detecting speed information from the digitally converted value; and
- calculating the duty ratio by using the detected speed information.

15. The motor driving control method of claim 14, wherein the calculating of the duty ratio comprises:
- when the speed control signal is a PWM signal, calculating the duty ratio from the PWM signal.

\* \* \* \* \*